United States Patent
Rentmore

[11] Patent Number: 5,939,673
[45] Date of Patent: *Aug. 17, 1999

[54] HOUSING FOR AN EQUIPMENT RACK

[75] Inventor: Alan Paul Rentmore, Basingstroke, United Kingdom

[73] Assignee: Airspan Communications Corporation, Feltham, United Kingdom

[*] Notice: This patent is subject to a terminal disclaimer.

[21] Appl. No.: 08/960,050

[22] Filed: Oct. 29, 1997

[30] Foreign Application Priority Data

Jul. 14, 1997 [GB] United Kingdom .................. 9714781

[51] Int. Cl.[6] ................................................ H01R 13/502
[52] U.S. Cl. ................................................ 174/59; 174/51
[58] Field of Search .................................. 174/50, 59, 51, 174/35 C; 220/3.92, 3.94, 4.02

[56] References Cited

U.S. PATENT DOCUMENTS

| | | | |
|---|---|---|---|
| 3,210,609 | 10/1965 | Appleton | 174/50 X |
| 4,903,170 | 2/1990 | Finney et al. | 361/424 |
| 5,319,520 | 6/1994 | Sugiyama et al. | 361/693 |
| 5,574,256 | 11/1996 | Cottone | 220/4.02 X |
| 5,655,837 | 8/1997 | Ridley et al. | 174/50 X |

FOREIGN PATENT DOCUMENTS

| | | | |
|---|---|---|---|
| 0417961 | 3/1991 | European Pat. Off. | H05K 7/18 |
| 2268629 | 1/1994 | United Kingdom | H05K 7/18 |
| 2282706 | 4/1995 | United Kingdom | H05K 5/00 |

Primary Examiner—Dean A. Reichard
Attorney, Agent, or Firm—Baker & Botts, L.L.P.

[57] ABSTRACT

The present invention provides a housing for holding a rack of equipment (210), comprising a main enclosure portion (200) for retaining the rack (210), the main enclosure portion (200) having a first opening for receiving the rack (210) and comprising a first wall (310) defining at least one edge of said first opening. A wiring portion (205), distinct from said main enclosure portion (200), is also provided for receiving wires (220) to be routed to said rack (210), and the first wall (310) is arranged to separate the wiring portion (205) from said main enclosure portion (200), such that the wiring portion (205) is located between the first wall (310) and a front face of the housing. Due to the proximity of the wiring portion (205) to the front face of the housing, this arrangement significantly improves access to the wiring of the housing, thereby reducing the time taken to install and commission a system, and to perform routine checks on the wiring.

12 Claims, 5 Drawing Sheets

5,939,673

HOUSING FOR AN EQUIPMENT RACK

TECHNICAL FIELD OF THE INVENTION

The present invention relates generally to housings used to hold items of equipment, and in particular to a housing for holding an equipment rack.

BACKGROUND OF THE INVENTION

Housings developed for holding racks of equipment generally take the form of a tower of substantially rectangular cross-section. A number of Standards have been established over the years to define certain features of these housings, so that racks of equipment can then be designed to be held in any housing that meets a defined "Standard". One such Standard is the European Telecommunications Standards Institute (ETSI) Standard, which defines the cross-sectional dimensions of the rack, often referred to as the "footprint", the spacing of the mounting holes, etc.

A typical prior art housing is illustrated in FIGS. 1A and 1B. FIG. 1A illustrates a plan view of a typical prior art housing, whilst FIG. 1B illustrates a perspective view. As illustrated in FIG. 1A, a back wall 100 has two internal side walls 120 depending therefrom. Each internal side wall 120 is bent at its far end to form a U-shaped end portion 130, which provides the side wall 120 with increased structural rigidity.

External detachable side walls 150 are provided, which may be attached to the back wall 100 of the housing. Further, a front cover 160 may be attached to the front of the housing if desired. This front cover 160 may take the form of a detachable panel, or alternatively may be provided as a hinged door attached to the housing.

With the front cover removed, or hinged open, a rack of equipment may be inserted into the housing, and attached by a suitable fastening mechanism, for example a number of bolts, to the front faces 140 of the internal side walls 120. Due to the U-shaped sections 130 provided in the side walls 120, these side walls 120 have sufficient mechanical rigidity to retain one or more racks of equipment.

As illustrated in FIG. 1B, wiring that needs to be routed to a rack of equipment may be threaded down the gaps 170 between the internal side walls 120 and the external side walls 150, and may then be passed through appropriate openings 190 in the side walls 120 in order that they can be connected to the racks.

As is apparent from FIGS. 1A and 1B, one problem with such a prior art arrangement is that the front access to the spaces 170 containing the wiring is through a rather restricted narrow entrance 180, this narrow entrance being formed as a direct result of the U-shaped channels 130 introduced to improve mechanical rigidity. This can impede maintenance work, and/or the introduction of new wiring into the housing, particularly if a number of similar housings are located side by side, so that there is no longer the possibility of removing the side walls 150 in order to obtain side access to these wiring areas. Since Standards such as the ETSI Standard will dictate the overall dimension "X" illustrated in FIG. 1A, it is not possible merely to increase the width of the housing, in order to improve the front access to the wiring through the opening 180.

Hence, it is an object of the present invention to provide a housing for holding a rack of equipment, which provides improved access to the wiring routed within such a housing.

SUMMARY OF THE INVENTION

Viewed from a first aspect, the present invention provides a housing for holding a rack of equipment, comprising: a main enclosure portion for retaining the rack, the main enclosure portion having a first opening for receiving the rack and comprising a first wall defining at least one edge of said first opening; a wiring portion, distinct from said main enclosure portion, for receiving wires to be routed to said rack; the first wall being arranged to separate the wiring portion from said main enclosure portion, and the wiring portion being located between the first wall and a front face of the housing.

In accordance with the present invention, a first wall of the main enclosure portion is used to separate the wiring portion from the main enclosure portion, and the wiring portion is positioned forward of the first opening in the main enclosure portion, between the first wall and a front face of the housing. Due to the proximity of the wiring portion to the front face of the housing, this arrangement significantly improves access to the wiring of the housing, thereby reducing the time taken to install and commission a system, and to perform routine checks on the wiring.

In preferred embodiments, the wiring portion has a second opening for inserting said wires in to the wiring portion, the first opening and second opening being accessible from the front face of the housing. This arrangement is particularly preferable, since racks can be readily inserted and removed, and the necessary wiring then readily connected to, or disconnected from, those racks, via the front access to both the main enclosure portion and the wiring portion.

Preferably, the wires are routed through said first wall to said rack. In preferred embodiments, each said wire consists of two separate wires, the first wire being located within the wiring portion, the second wire being located within the main enclosure portion, and the first and second wires being electrically connected to each other by a bulkhead connector attached to the first wall. When connected to the bulkhead connector, the first and second wires form a single electrical path for the transmission of signals to the rack. Further, if the first wall is made of a conductive material, the bulkhead connector ensures that a good electrical contact is made with the conductive wall, and that hence an outer portion of both the first and second wires are earthed against the conductive wall. This effectively inhibits the transmission of noise along the wires to the rack.

In preferred embodiments, a part of the first wall comprises a mounting plate formed on the rack, and the bulkhead connector is attached to said mounting plate. This approach enables the bulkhead connector to be fitted, and the second wire to then be connected between the bulkhead connector and the rack, prior to the rack being positioned within the housing. When the mounting plate is mounted on the first wall, all that is then required is for the first wire to be connected directly to the bulkhead connector with the rack "in situ". This approach hence further eases installation of the rack.

Preferably, the wiring portion is connected to said first wall. In preferred embodiments, a back wall of said wiring portion is provided adjacent said first wall, and a first side wall of the wiring portion depends from the main enclosure portion. This first side wall may be formed from a unitary piece of material also forming part of the main enclosure portion, or alternatively may be entirely separate from the main enclosure portion. In preferred embodiments, this first side wall of the wiring portion is formed from a piece of metal having an increased mechanical strength over the material used to form the walls of the main enclosure portion, and hence this first side wall of the wiring portion, when connected to the main enclosure portion, increases the mechanical strength of the housing.

In preferred embodiments, a second side wall of the wiring portion is formed by an edge of the rack. Further, in areas of the housing not occupied by a rack, the second side wall is preferably formed by an edge of a blank insert that is inserted into those areas.

In preferred embodiments, the housing further comprises a plurality of walls arranged to define said main enclosure portion, at least two of said walls being formed from a single piece of conductive material. It has been found that any gaps between the outer walls of said main enclosure portion may act as slot antennae which propagate noise from the housing, and hence can cause the housing to not meet emission requirements. This effect is even more noticeable if any of the side walls are not properly earthed. Hence, by ensuring that at least two of the side walls are formed from a single piece of conductive material, the gap that would otherwise exist between those two walls is removed, and hence the emissions from the housing are reduced. In preferred embodiments, the plurality of walls are formed from a single piece of conductive material, thereby further reducing the emissions that may otherwise have been caused by gaps between the walls.

Preferably, a cover is provided for said second opening, which is attachable to the wiring portion. This protects the wires from damage during use, but is readily removable in order to obtain access to the wiring portion.

Viewed from a second aspect, the present invention provides a central terminal for a wireless telecommunications system, comprising a housing in accordance with the first aspect of the present invention, and a number of racks of equipment retained in the housing.

BRIEF DESCRIPTION OF THE DRAWINGS

The present invention will be described further, by way of example only, with reference to a preferred embodiment thereof as illustrated in the accompanying drawings, in which.

DETAILED DESCRIPTION OF THE INVENTION

Figure 1A:
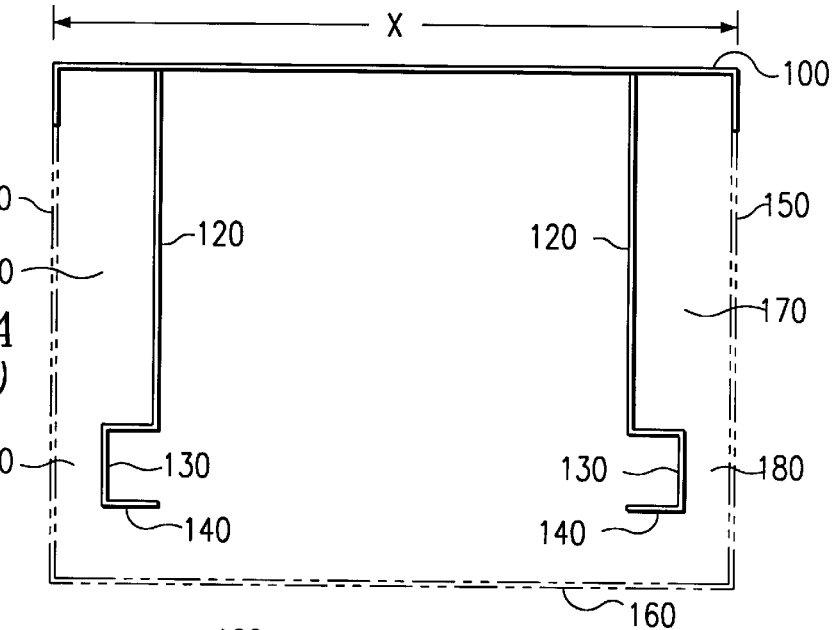
FIGS. 1A and 1B illustrate a typical prior art housing used for retaining one or more racks of equipment.
Figure 1B:
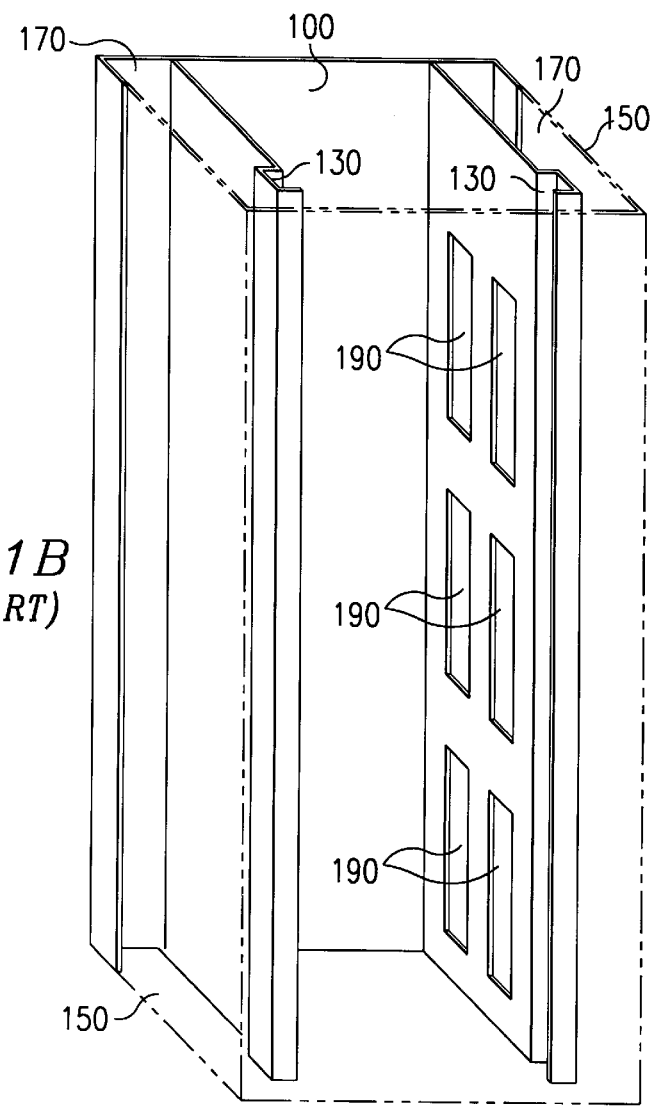
Figure 2:
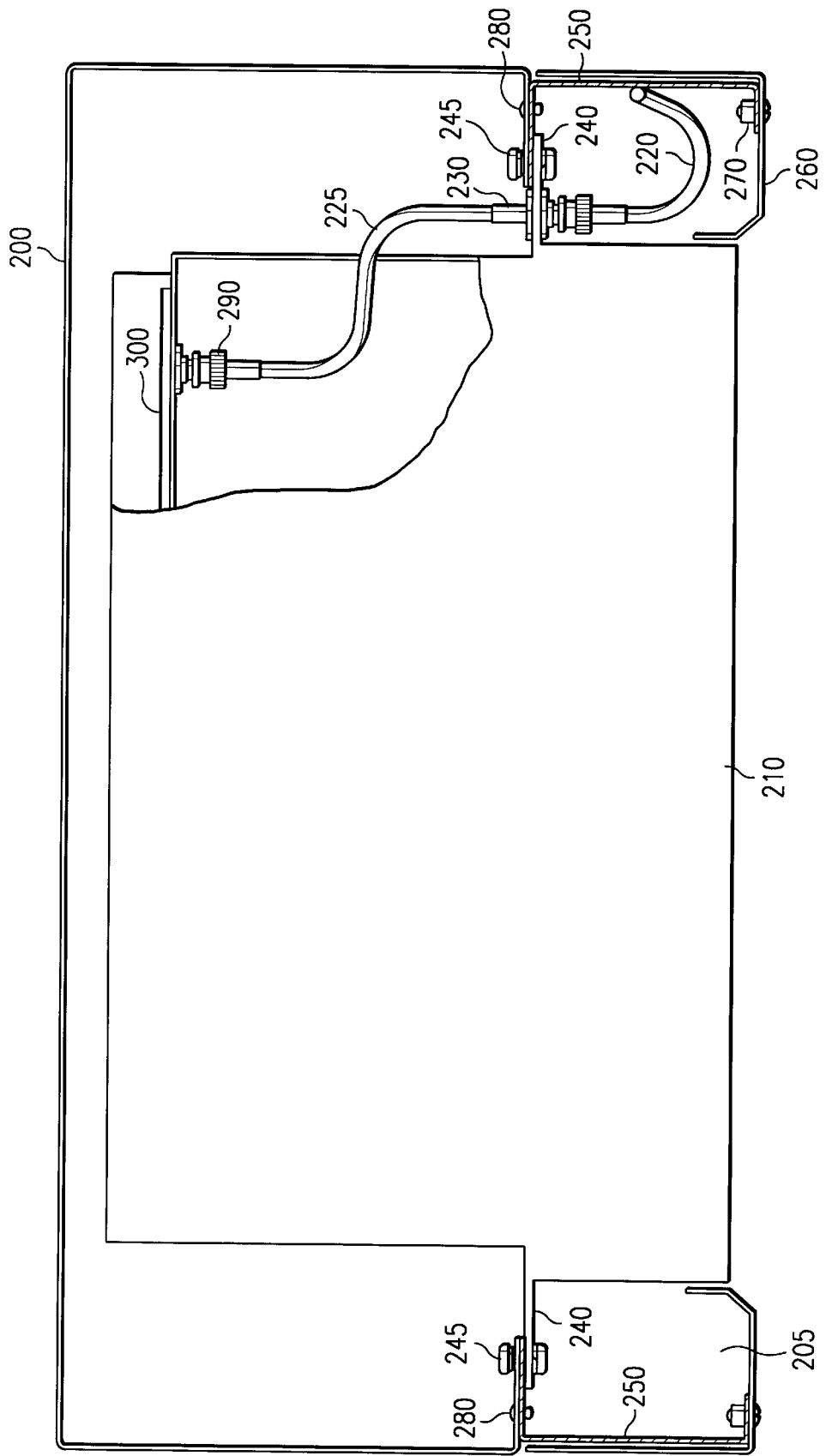
FIG. 2 illustrates a plan view of a housing in accordance with preferred embodiments of the present invention.

FIG. 2 illustrates a housing for an equipment rack, in accordance with preferred embodiments of the present invention. As illustrated in FIG. 2, the main enclosure portion 200 of the housing is formed from a unitary sheet of conductive material, for example sheet steel.

It has been found that any gaps between the outer walls of said main enclosure portion can act as slot antennae which propagate noise from the housing, and hence can cause the housing to not meet emission requirements. Often, the walls of the main enclosure are painted, and hence even if the walls do abut each other, the thin layer of paint will act as an insulating layer between the two walls, and hence have the same effect as an actual gap.

Hence, by forming all of the side walls of the main enclosure portion from a single sheet of conductive material, such as a sheet of metal, the gaps that would otherwise exist between the walls are removed, and hence the emissions from the housing are reduced.

When a rack of equipment 210 is inserted into the housing, it is, in accordance with preferred embodiments of the present invention, fastened to the walls 310 of the main enclosure portion 200 via suitable fastening devices, such as screws and cage nuts 245, mounting plates 240 being provided on each side of the rack for receiving the screws.

In preferred embodiments, the mounting plates 240 are also made of a conductive material, preferably steel, and hence an electrically conductive path is formed from the mounting plates 240 to the walls of the main enclosure portion 200 via the screws and cage nuts 245.

Also attached to the front face of the main enclosure portion are two U-shaped sheets 250, these preferably being mounted onto the front walls 310 of the main enclosure portion 200 via the screws and cage nuts 245 and by rivets 280. Preferably, these sheets 250 are made of metal of a thickness somewhat greater than that of the walls of the main enclosure portion 200. Once these sheets 250 are attached to the front face 310 of the main enclosure portion 200, they serve to increase the structural rigidity of the housing. Further, these sheets 250 serve to define a wiring portion 205 in which wires destined for the rack may be routed.

Figure 3:
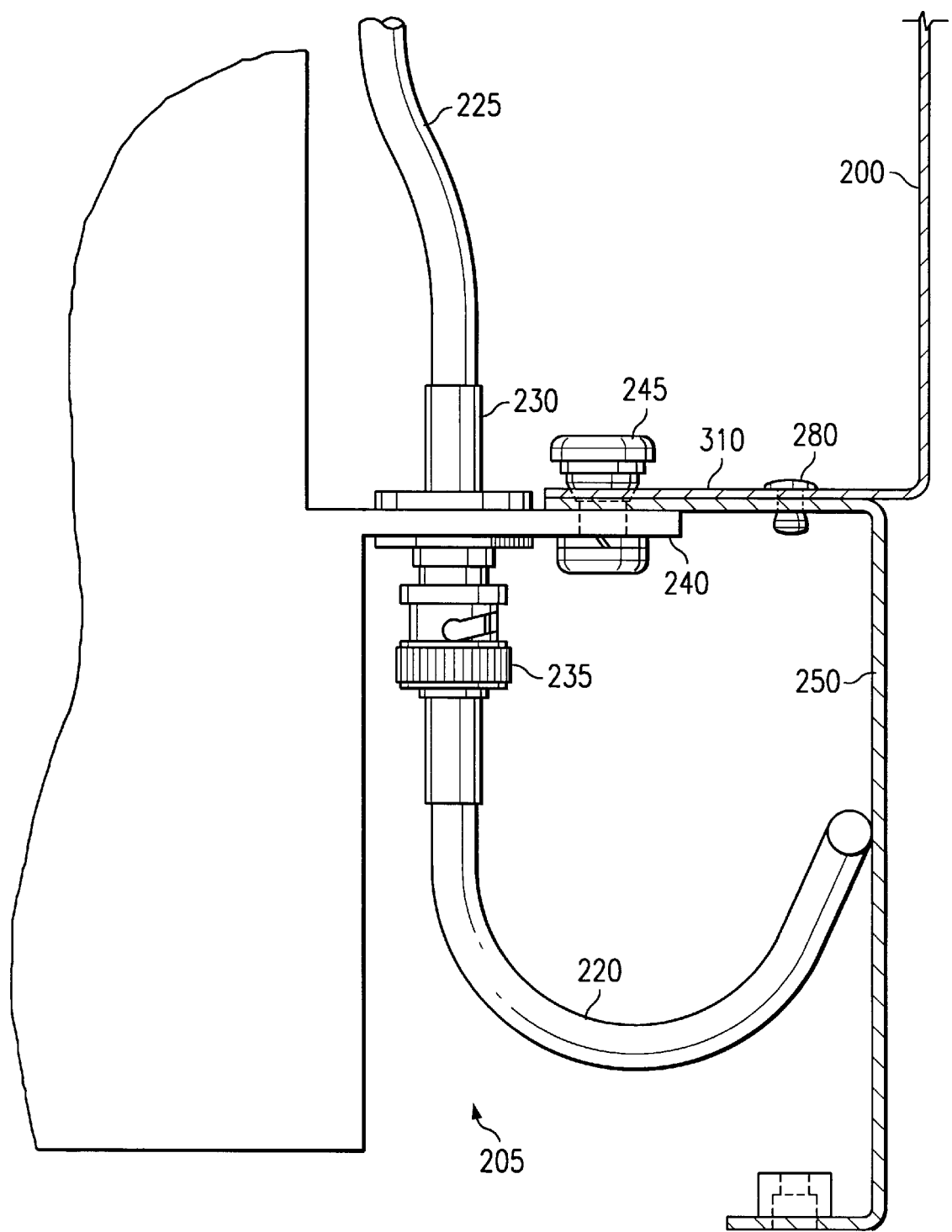
FIG. 3 provides an enlarged view of a portion of the housing illustrated in FIG. 2.
Figure 4:
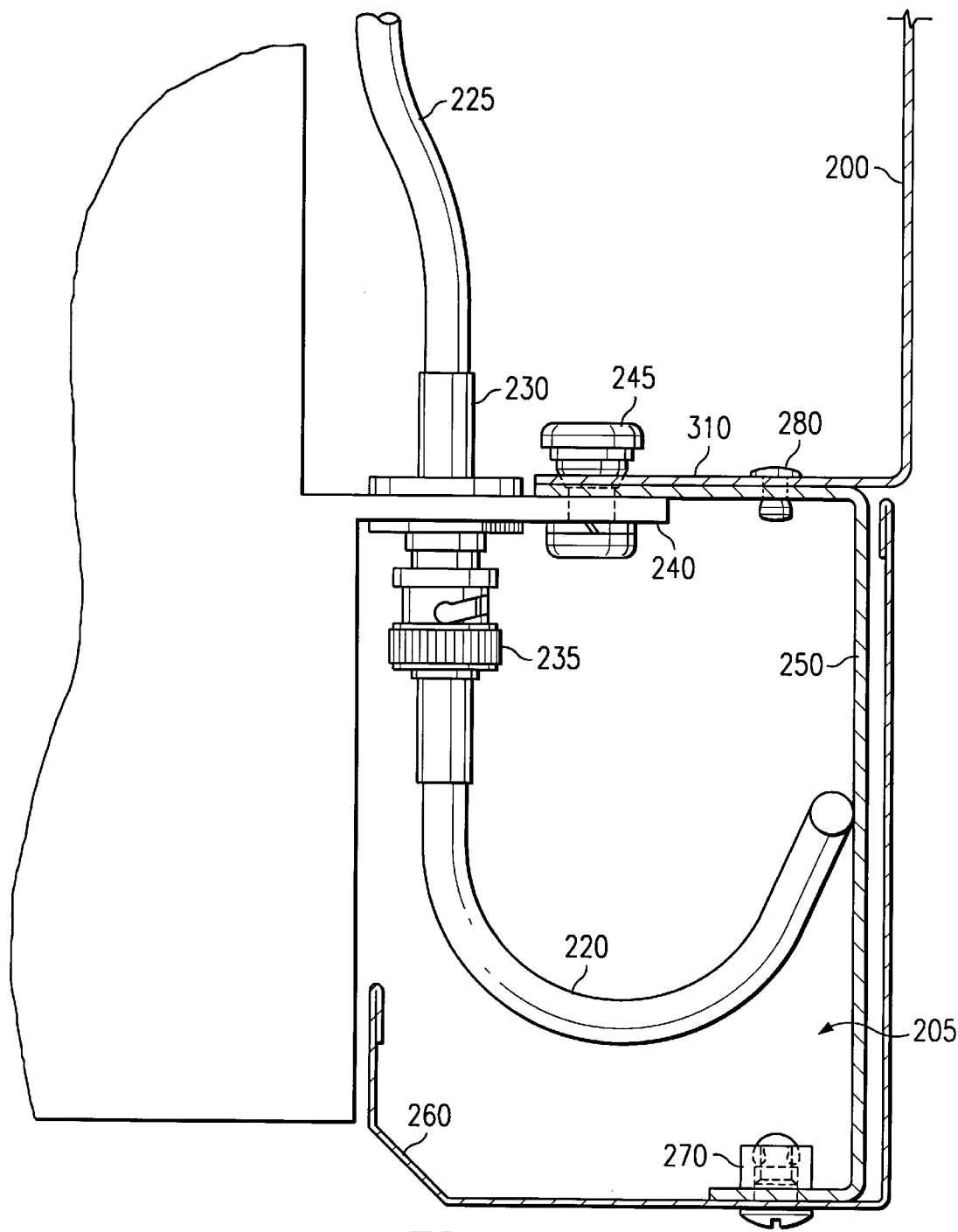
FIG. 4 illustrates an enlarged view of a portion of the housing illustrated in FIG. 2, in which a removable cover is connected to the wiring portion.

As illustrated in FIG. 2, and shown in more detail in FIGS. 3 and 4, one such wire 220 is drawn within the wiring portion 205. In preferred embodiments, these wires are coaxial cables, having a central metallic core along which the signal passes, and a metallic shielding layer displaced radially outwardly from the central core for shielding the central core from external noise such as electromagnetic emissions from other equipment in the vicinity.

At one end of the coaxial cable 220, a connector 235 is attached, this connector being arranged to be inserted into a bulkhead connector 230 provided on the mounting plate 240 of the rack 210.

It will be appreciated by those skilled in the art that, since the mounting plate 240, the sheet 250, and the walls 200 of the main enclosure portion, are preferably all made of electrically conductive material, then the bulkhead connector 230 may be provided at any suitable position between the wiring portion 205 and the main enclosure portion 200 to enable the cable 220 to be routed into the main enclosure portion 200. However, in preferred embodiments, the bulkhead connector 230 is provided on the mounting plate 240, since this enables the rack 210 to be assembled prior to installation in the housing, with a further portion of coaxial cable 225 extending from the bulkhead connector 230 to a point of connection 300 on the rack 210. As illustrated in FIG. 2, the point of connection 300 may be a backplane of the rack, and a suitable connector can be provided so as to allow the connector 290 attached to the end of the coaxial cable 225 to be connected to the backplane 300.

By employing this arrangement, all that is required by the installation engineer is to install the rack 210 within the main enclosure portion 200 by fastening the mounting plates 240 to the walls 310 with the screws and cage nuts 245, and then to connect the connector 235 of the coaxial cable 220 to the bulkhead connector 230.

The coaxial cable 220 may be of a significant length, typically extending over a substantial length of the housing from top to bottom, and such cables are prone to propagate any external emissions as noise along the shielding layer of the coaxial cable 220. However, since the shielding layer of the coaxial cable 220 is connected via the bulkhead connector 230 to the mounting plate 240, and hence to the walls of the main enclosure portion 200, then any signal being transmitted along this outer shielding layer as noise is earthed against the conductive walls of the main enclosure portion, and hence is not propagated along the coaxial cable 225 to the point of connection 300 with the rack 210. Hence, the arrangement illustrated in FIGS. 2 to 4 provides a simple yet effective mechanism for removing any noise propagated along the coaxial cable 220 before the cable enters the main enclosure portion and is routed to the rack 210.

As illustrated in FIGS. 2 and 4, a cover 260 may be attached via a fastening device 270, such as a quick release fastener, to the sheet 250 defining the wiring portion 205, this cover enabling the wires within the wiring portion to be enclosed during normal use so as to reduce the likelihood of any damage to the wires. Further, the cover 260 can be readily removed to allow easy access to the wiring portion 205 from the front face of the housing.

Hence, in accordance with the housing structure of preferred embodiments as illustrated in FIGS. 2 to 4, the opening of the main enclosure portion 200 through which the rack 210 is inserted into the main enclosure portion, and the opening in the wiring portion through-which the wires can be inserted into the wiring portion, both are accessible directly from the front face of the housing, this significantly simplifying the installation process. This ease of access to the wiring portions is obtained whilst still ensuring that the overall housing meets the "footprint" requirements of Standards such as the ETSI Standard. In accordance with preferred embodiments of the present invention, the wiring portions are located between the walls 310 forming part of the main enclosure portion 200 and the front face of the housing.

A further aspect of the design which eases the installation of racks into the housing is the use of the bulkhead connector 230, which avoids the requirement to attach Ferrites to the cables in order to remove noise being transmitted along them. Further, if the bulkhead connector 230 is provided within the mounting plate 240 of the rack 210, the use of such a bulkhead connector enables the wiring of the rack contained within the main enclosure portion 200 to be completed prior to the actual installation of the rack 210 within the housing. This further eases the job of the installation engineer, and hence these measures tend to reduce the time taken to install and commission a new system.

As mentioned earlier, the use of a single sheet of metallic material to form the side walls of the main enclosure portion 200 helps to reduce the emissions from the housing. In addition, since this arrangement reduces the number of parts required to construct the housing, the actual cost for producing the housing is reduced. The main enclosure portion can be formed from three main parts, namely the single, shaped sheet of conductive material forming the side walls of the main enclosure portion 200, a base portion to which the side walls are fastened, and a top cover attached to the upper edge of the side walls. Preferably, the base portion and top cover are riveted to the side walls and then tack welded to ensure electrical continuity. As mentioned earlier, the generally U-shaped sheets 250 are then added to increase the structural rigidity of the housing, and to define the wiring portion used for routing the wires.

As shown in FIGS. 2 to 4, in preferred embodiments one side wall of the wiring portion 205 is provided by the sheet 250, whilst the other side wall of the wiring portion is provided by an edge of the rack. However, in those areas of the housing where a rack has not been attached to the housing, a blank insert is preferably inserted into the housing, and an edge of the blank insert is used to define a second side wall of the wiring portion 205.

It will be appreciated by those skilled in the art that a housing as described above may be used to retain a plurality of racks for any number of different purposes. However, one particular embodiment in which the housing may be used is to retain a number of racks which, in combination, form a central terminal of a wireless telecommunications system. Such a wireless telecommunications system may be based on providing fixed radio links between subscriber terminals at fixed locations within a service area and the central terminal for that service area. The central terminal then typically interfaces with a public switch telephone network (PSTN) so that calls can take place between the PSTN and items of telecommunications equipment connected to the subscriber terminals.

Figure 5:
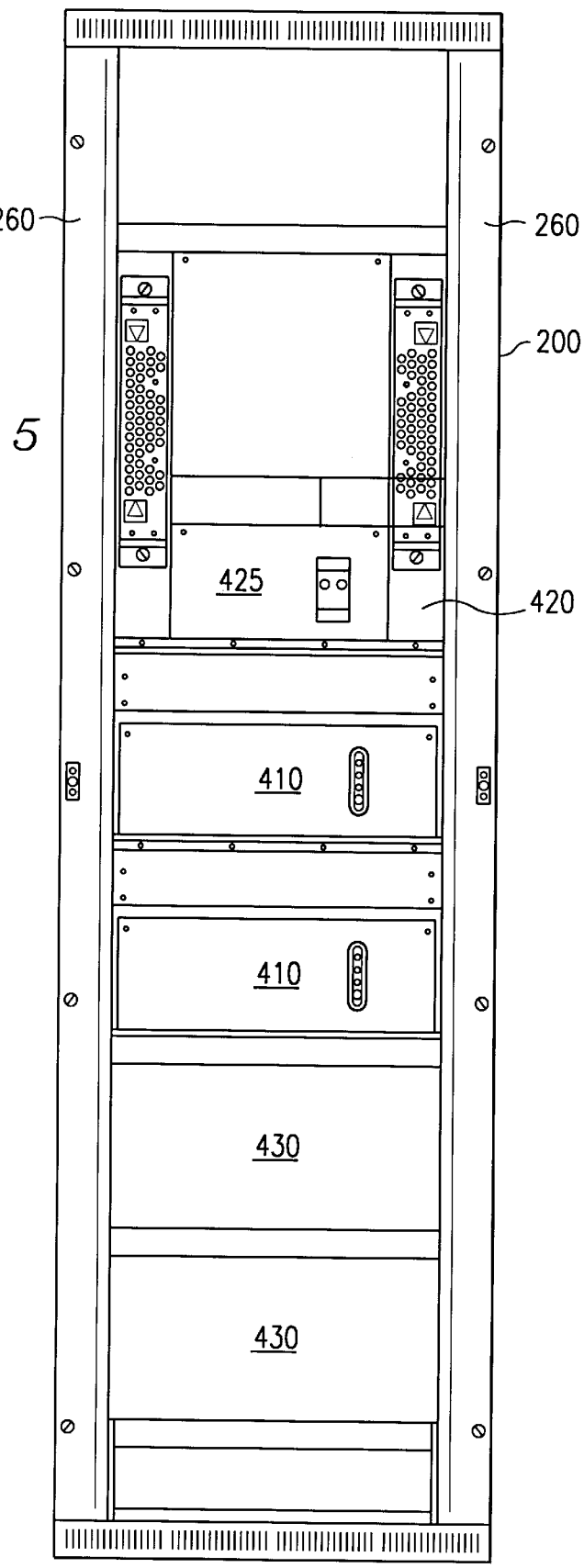
FIG. 5 illustrates a central terminal of a wireless telecommunications system which uses a housing in accordance with preferred embodiments of the present invention.

FIG. 5 is a schematic illustration of a central terminal for such a wireless telecommunications system, which is formed by a number of racks inserted into a housing in accordance with preferred embodiments of the present invention. The central terminal consists of a number of equipment racks, including an RF combiner and power amp rack 420, which also contains a power supply 425, and a number of (in this example two) modem shelves 410. The RF combiner shelf 420 allows the modem shelves 410 to operate in parallel. If "n" modem shelves are provided, then the RF combiner shelf 420 combines and amplifies the power of "n" transmit signals, each transmit signal being from a respective one of the "n" modem shelves, and amplifies and splits received signals "n" ways so that separate signals may be passed to the respective modem shelves. The power supply 425 provides a connection to the local power supply and fusing for the various components in the housing 200.

In accordance with preferred embodiments, a bidirectional connection extends between the RF combiner shelf 420 and a central terminal antenna, such as an omnidirectional antenna mounted on a central terminal mast, this antenna enabling the central terminal to communicate with the subscriber terminals of the service area. Preferably, this bidirectional connection enters the housing through the top cover of the housing.

In preferred embodiments of the present invention, baseband cables for carrying the signals between the RF Combiner shelf 420 and the modem shelves 410, and the necessary power cables to each of the modem shelves, are passed down the inside of one of the walls forming the main enclosure portion 200. Since these cables are entirely internal to the housing, it can be easier to preinstall these in the housing rather than routing them via the separate wiring portion, although it will be appreciated by those skilled in the art that this latter approach could also be taken. If these cables are passed down the inside of one of the walls of the main enclosure portion 200, it is especially important to make sure that they are well screened to minimise noise emitted from them.

However, the central terminal also includes a number of coaxial cables used to route signals between the modem shelves 410 and the PSTN exchange, each such coaxial cable generally being referred to as an E1 connection. As the number of users of telecommunications networks increases, there is an ever increasing demand for such networks to be able to support more users. To increase the number of users that may be supported by a single central terminal, the wireless telecommunications system can be arranged to operate in a Demand Assignment mode, in which a larger number of subscriber terminals are associated with the central terminal than can be managed via the wireless links between the central terminal and the subscriber terminals at any one moment in time. The wireless links are then assigned to particular subscriber terminals on demand as needed. All of these subscriber terminals require a point of presence at the PSTN exchange, and this increases the number of E1 connections that need to be provided between the central terminal and the PSTN.

Hence, there can potentially be a large number of coaxial cables that need to be routed to the modem shelves 410 within the housing 200. All of these coaxial cables may propagate noise along the outer shielding layer of the cables, and hence, without the use of the techniques described in relation to the housing of the preferred embodiment of the present invention, much of that noise would be propagated onto the equipment racks 210, and hence possibly adversely effect the operation of the components on those racks. However, in accordance with preferred embodiments of the present invention, all of these coaxial cables are routed along the wiring portion 205 and then enter the main enclosure portion 200 at the appropriate level via a bulkhead connector 230, which earths the outer shielding layer of the coaxial cable to the conductive wall of the main enclosure portion 200, thereby inhibiting the transmission of noise along those cables to the rack.

As illustrated in FIG. 5, in those portions of the housing 200 where an equipment rack is not present, blank inserts 430 are provided, and an edge of these blank inserts is used to define a second side wall of the wiring portions 205.

FIG. 5 shows a front elevation of the housing, with the wiring portion covers 260 attached in place to protect the cables from damage during normal use. These covers 260 are readily removed, to enable access to the wiring portions from the front of the housing, thereby easily enabling new cables to be inserted, and/or cables already in position to be checked and maintained.

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

What is claimed is:

1. A housing for holding a rack of equipment, comprising:

a main enclosure portion for retaining the rack, the main enclosure portion having a first opening for receiving the rack and comprising a first wall defining at least one edge of said first opening;

a wiring portion, distinct from said main enclosure portion, for receiving wires to be routed to said rack;

the first wall being arranged to separate the wiring portion from said main enclosure portion, and the wiring portion being located between the first wall and a front face of the housing.

2. A housing as claimed in claim 1, wherein the wiring portion has a second opening for inserting said wires in to the wiring portion, the first opening and second opening being accessible from the front face of the housing.

3. A housing as claimed in claim 1, wherein the wires are routed through said first wall to said rack.

4. A housing as claimed in claim 3, wherein each said wire consists of two separate wires, the first wire being located within the wiring portion, the second wire being located within the main enclosure portion, and the first and second wires being electrically connected to each other by a bulkhead connector attached to the first wall.

5. A housing as claimed in claim 4, wherein a part of the first wall comprises a mounting plate formed on the rack, and the bulkhead connector is attached to said mounting plate.

6. A housing as claimed in claim 1, wherein the wiring portion is connected to said first wall.

7. A housing as claimed in claim 1, wherein a back wall of said wiring portion is provided adjacent said first wall, and a first side wall of the wiring portion depends from the main enclosure portion.

8. A housing as claimed in claim 7, wherein a second side wall of the wiring portion is formed by an edge of the rack.

9. A housing as claimed in claim 8, wherein the second side wall is formed by an edge of a blank insert inserted in to areas of the housing not occupied by said rack.

10. A housing as claimed in claim 1, further comprising a plurality of walls arranged to define said main enclosure portion, at least two of said walls being formed from a single piece of conductive material.

11. A housing as claimed in claim 10, wherein said plurality of walls are formed from a single piece of conductive material.

12. A housing as claimed in claim 2, further comprising a cover for said second opening attachable to said wiring portion.

* * * * *